US011459651B2

(12) United States Patent
Wang et al.

(10) Patent No.: US 11,459,651 B2
(45) Date of Patent: Oct. 4, 2022

(54) PASTE METHOD TO REDUCE DEFECTS IN DIELECTRIC SPUTTERING

(71) Applicant: APPLIED MATERIALS, INC., Santa Clara, CA (US)

(72) Inventors: Xiaodong Wang, San Jose, CA (US); Rongjun Wang, Dublin, CA (US); Hanbing Wu, Millbrae, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 356 days.

(21) Appl. No.: 15/426,102

(22) Filed: Feb. 7, 2017

(65) Prior Publication Data
US 2018/0223421 A1 Aug. 9, 2018

(51) Int. Cl.
*C23C 14/58* (2006.01)
*C23C 14/34* (2006.01)
(Continued)

(52) U.S. Cl.
CPC ........ *C23C 14/5853* (2013.01); *C23C 14/081* (2013.01); *C23C 14/14* (2013.01); *C23C 14/185* (2013.01); *C23C 14/3464* (2013.01); *C23C 14/352* (2013.01); *H01J 37/3417* (2013.01); *H01J 37/3447* (2013.01); *H01J 37/3405* (2013.01); *H01J 37/3429* (2013.01); *H01L 43/12* (2013.01)

(58) Field of Classification Search
CPC ............... H01J 37/3405; H01J 37/3408; H01J 37/3441; H01J 37/3455; H01J 37/32642; H01J 37/3417; C23C 15/345; C23C 14/35; C23C 14/548; C23C 14/564; C23C 14/3492; C23C 14/5853; C23C 14/352; C23C 14/3464
See application file for complete search history.

(56) References Cited

U.S. PATENT DOCUMENTS 5,382,339 A 1/1995 Aranovich
5,803,977 A 9/1998 Tepman et al.
(Continued)

FOREIGN PATENT DOCUMENTS

CN 102468228 A 5/2012
EP 0780486 A1 6/1997
(Continued)

OTHER PUBLICATIONS

Machine Translation JP07197250A (Year: 1995).*
(Continued)

*Primary Examiner* — Michael A Band
(74) *Attorney, Agent, or Firm* — Moser Taboada

(57) ABSTRACT

Embodiments of a tantalum (Ta) target pasting process for deposition chambers using RF powered processes include pasting at least a portion of the inner surfaces of the process chamber with Ta after using RF sputtering to deposit dielectric material on a wafer. Pressure levels within the process chamber are adjusted to maximize coverage of the Ta pasting layer. The Ta pasting encapsulates the dielectric material that has been inadvertently sputtered on the process chamber inner surfaces such as the shield. Oxygen is then flowed into the process chamber to form a tantalum oxide layer on the Ta pasting layer to further reduce contamination and particle generation.

3 Claims, 3 Drawing Sheets

(51) Int. Cl.
*C23C 14/08* (2006.01)
*C23C 14/14* (2006.01)
*C23C 14/18* (2006.01)
*C23C 14/35* (2006.01)
*H01J 37/34* (2006.01)
*H01L 43/12* (2006.01)

(56) References Cited

U.S. PATENT DOCUMENTS

| | | | |
|---|---|---|---|
| 6,027,585 | A | 2/2000 | Patterson et al. |
| 6,365,009 | B1 * | 4/2002 | Ishibashi .............. C23C 14/35 |
| | | | 204/192.12 |
| 6,589,398 | B1 | 7/2003 | Lu et al. |
| 8,679,301 | B2 | 3/2014 | Park |
| 2003/0196890 | A1 | 10/2003 | Le et al. |
| 2009/0035462 | A1 | 2/2009 | Park |
| 2014/0110248 | A1 | 4/2014 | Cao et al. |
| 2015/0102461 | A1 * | 4/2015 | Lee .................. H01L 27/10814 |
| | | | 257/532 |
| 2015/0247217 | A1 | 9/2015 | Zou et al. |
| 2015/0251000 | A1 | 9/2015 | Kane et al. |
| 2015/0329956 | A1 | 11/2015 | Wakayanagi et al. |
| 2016/0086775 | A1 | 3/2016 | Forster et al. |
| 2016/0164490 | A1 * | 6/2016 | Kamijo ................ H03H 9/0509 |
| | | | 310/348 |

FOREIGN PATENT DOCUMENTS

| | | | | |
|---|---|---|---|---|
| JP | 07197250 | A * | 8/1995 | ........... C03C 17/245 |
| JP | H07-197250 | | 8/1995 | |
| JP | 2014047398 | A | 3/2014 | |
| WO | WO 03-090248 | A2 | 10/2003 | |

OTHER PUBLICATIONS

Depla, D.; Mahieu, S.; Greene, J.; Sputter Deposition Process. Department of Solid State Sciences, Ghent Univerity, Belgium; Materials Science and Physics Departments and the Frederick Seitz Materials Research Laboratory, University of Illinois, Urbana, Illinois, USA. (Year: 2010).*

"Encapsulate" definition. Oxford Languages [https://www.google.com/search?q=encapsulate&rlz=1C1GCEB_en&oq=encapsulate&aqs=chrome..69i57j0i131i433i512l2j0i433i512l2j0i512l5.7289j1j1&sourceid=chrome&ie=UTF-8].*

International Search Report and Written Opinion dated May 15, 2018 for PCT Application No. PCT/US2018/016384.

Chinese Search Report for Application No. 2018800107062, dated Apr. 9, 2021.

D. Depla et al. Chapter 5 Sputter Depostion Processes. Handbook of Deposition Technologies for Films and Coatings (Third Edition). pp. 253-296 (Dec. 17, 2009).

* cited by examiner

PASTE METHOD TO REDUCE DEFECTS IN DIELECTRIC SPUTTERING

FIELD

Embodiments of the present disclosure generally relate to substrate process chambers used in semiconductor manufacturing systems.

BACKGROUND

Sputtering, also known as physical vapor deposition (PVD), is a method of forming features in integrated circuits. Sputtering deposits a material layer on a substrate. A source material, such as a target, is bombarded by ions strongly accelerated by an electric field. The bombardment ejects material from the target, and the material then deposits on the substrate. During deposition, ejected particles may travel in varying directions, rather than generally orthogonal to the substrate surface, undesirably resulting in producing a layer of the source material on the inner structure of a process chamber.

The unwanted coating of the inner structure, such as on a shield or other inner surfaces of the process chamber, may cause defects and contamination in subsequent wafer processing. Contamination occurs when material from the unwanted coating combines with a desired material being deposited onto a wafer. The resulting wafer deposition film will be a mixture of the deposition material and the material from the coating of the inner structure. Defects in the wafer processing occur when particles from the unwanted coating fall into the deposition layer on the wafer. The wafer surface can be inspected to determine the quantity and size of the defects, but the wafer deposition film must be analyzed to determine the film's composition.

Direct current (DC) powered PVD chambers are typically used for metal wafer deposition processes because of their cost effectiveness and efficiency. However, when used with a dielectric material, the dielectric material eventually covers the electrodes within the chamber with an insulating film, halting the deposition process. Alternating current (AC) powered PVD chambers, such as Radio Frequency (RF) PVD chambers, have the ability to neutralize positive charges left on surfaces in the first half of the cycle with negative charges during the second half of the cycle. The cyclic nature allows RF PVD chambers to be used for both metal and dielectric wafer depositions, but with a lower deposition rate than DC powered PVD chambers.

RF sputtering causes a target material, not only to be deposited on a wafer, but also to be undesirably deposited on the shield and other inner surfaces of the process chamber. Typically, the shield is made of conductive material such as metal and, if a metal material target is being used, the metal on metal deposition does not interfere with the processing. However, when the target material is a dielectric, the dielectric deposition on the shield causes a charge build up that may lead to arcing within the process chamber. The arcing may cause particles to be dislodged from the dielectric layer on the inner surfaces and fall onto the wafer being processed. The particle generation can lead to a substantial amount of defects in the wafer deposition layer.

Thus, the inventors have provided improved methods for dielectric material deposition in RF powered processes in PVD chambers.

SUMMARY

Embodiments of a tantalum (Ta) target pasting process for RF PVD process chambers are provided herein. In some embodiments, a method for performing a pasting layer in a deposition chamber includes depositing a Ta pasting layer over at least a portion of a first dielectric material layer formed by RF sputtering of a dielectric material target on at least an interior portion of the deposition chamber, the Ta pasting layer reducing particle defects from the first dielectric material layer.

In some embodiments, a method for performing pasting in an RF PVD deposition chamber includes depositing a Ta pasting layer over magnesium oxide (MgO) on at least an interior portion of the PVD chamber by sputtering a Ta target to reduce particle defects from the magnesium oxide, flowing oxygen into the PVD chamber to bond with the Ta pasting layer to further reduce particle defects and to reduce Ta contamination of subsequent MgO depositions layers, and depositing an MgO deposition layer on at least an interior portion of the PVD chamber by sputtering an MgO target to further reduce Ta contamination of subsequent MgO deposition layers.

In some embodiments, a deposition chamber includes a process chamber having an inner volume and a shield disposed in the inner volume and having one or more sidewalls configured to surround a processing volume within the inner volume, wherein at least a portion of at least one surface of the shield having a dielectric material deposition layer formed by RF sputtering, and wherein at least a portion of the dielectric material deposition layer having a tantalum Ta deposition layer.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

Figure 1:
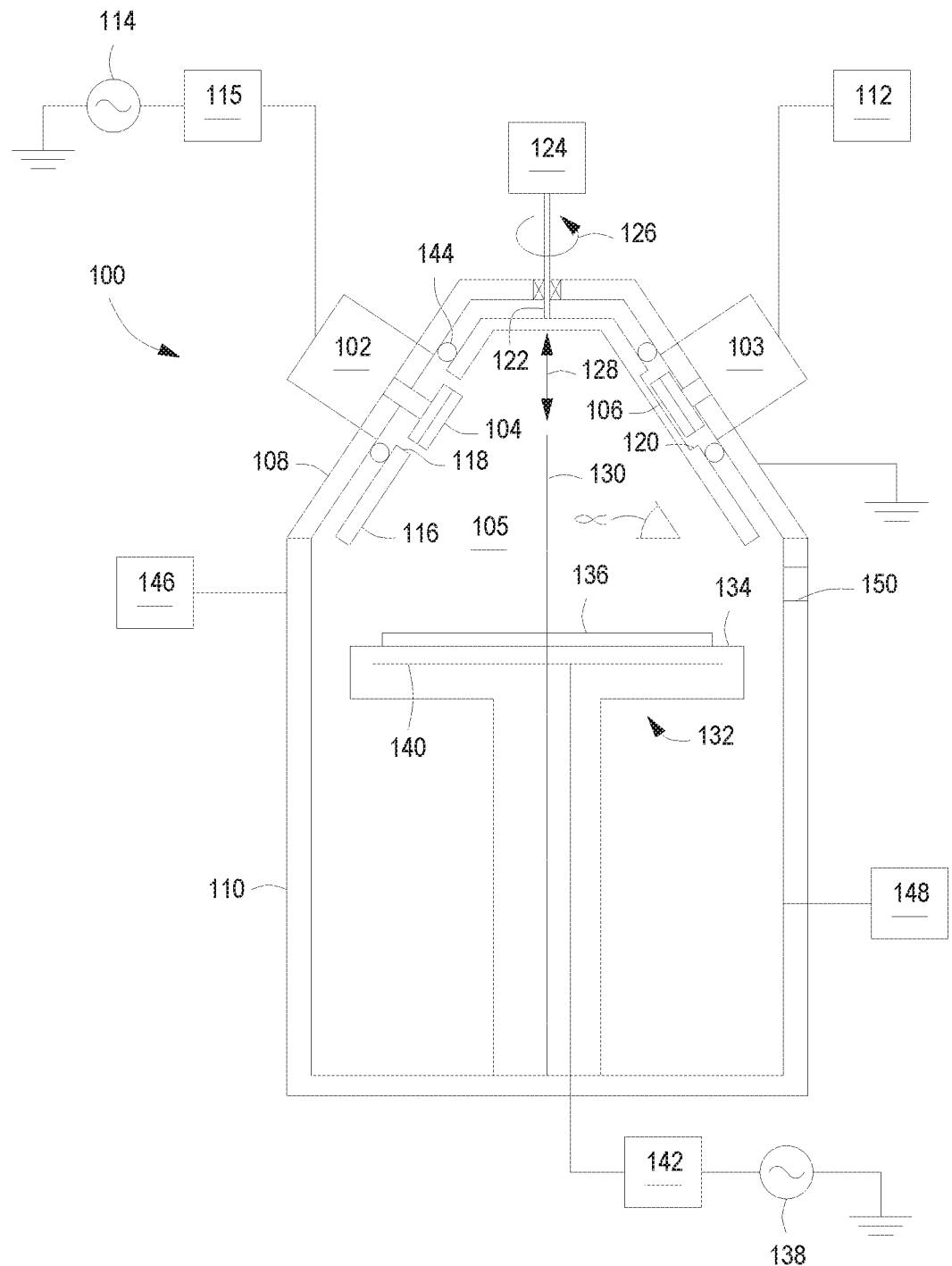
FIG. 1 depicts a schematic cross sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a tantalum (Ta) target pasting process for PVD process chambers are provided herein. The inventive methods leverage a Ta target sputtering process to paste at least a portion of the inner surfaces of the process chamber after a dielectric material deposition on a wafer. The Ta pasting encapsulates the dielectric material that has been inadvertently sputtered on the process chamber inner surfaces such as the shield. The Ta pasting greatly reduces the number of defects and the size of the defects caused by particles from the dielectric material that fall into deposition films. Additional processes are used to enhance the effects of the Ta pasting to further reduce both defects and contamination of the deposition films or layers.

In some embodiments, a PVD chamber such as, for example, a multi-cathode PVD chamber (e.g., process chamber 100) includes a plurality of cathodes 102, 103 having a corresponding plurality of targets (at least one dielectric target 104 and at least one metallic target 106), (for example, 5 cathodes) attached to the chamber body (for example, via a chamber body adapter 108). The processing chamber includes a substrate support 132 having a support surface 134 to support a substrate 136. The process chamber 100 includes an opening 150 (e.g., a slit valve) through which an end effector (not shown) may extend to place a substrate 136 onto lift pins (not shown) for lowering the substrate onto a support surface 134.

In the embodiment shown in FIG. 1, each target is disposed at a predetermined angle α with respect to the support surface 134. In some embodiments, the angle α may be between about 10° to about 50°. The substrate support includes an RF bias power source 138 coupled to a bias electrode 140 disposed in the substrate support 132 via a matching network 142. The chamber body adapter 108 is coupled to an upper portion of a chamber body 110 of the process chamber 100 and is grounded. Each cathode can have a DC power source 112 or an RF power source 114 and an associated magnetron. The dual power sources permits both DC powered processes and RF powered processes to occur in the same process chamber 100. In the case of the RF power source 114, the RF power source 114 is coupled to the cathode 102 via an RF matching network 115. The RF energy supplied by the RF power source 114 may range in frequency from about 13.56 MHz and to about 162 MHz or above. For example, non-limiting frequencies such as 13.56 MHz, 27.12 MHz, 60 MHz, or 162 MHz can be used.

The RF bias power source 138 may be coupled to the substrate support 132 in order to induce a negative DC bias on the substrate 136. In addition, in some embodiments, a negative DC self-bias may form on the substrate 136 during processing. For example, RF energy supplied by the RF bias power source 138 may range in frequency from about 2 MHz to about 60 MHz, for example, non-limiting frequencies such as 2 MHz, 13.56 MHz, or 60 MHz can be used. In other applications, the substrate support 132 may be grounded or left electrically floating.

A shield 116 is rotatably coupled to the chamber body adapter 108 and is shared by all the cathodes. Depending on the number of targets that need to be sputtered at the same time, the rotating shield 116 can have one or more holes to expose a corresponding one or more targets. The shield 116 limits or eliminates cross-contamination between the plurality of targets 104, 106. For example, in some embodiments where five cathodes are provided, the shield 116 may include at least one hole 118 to expose a target 104 to be sputtered and at least one pocket 120 to house a target (e.g., metallic target 106) that is not being sputtered. The shield 116 is rotationally coupled to the chamber body adapter 108 via a shaft 122. In some embodiments, the shield 116 has one or more sidewalls configured to surround a processing volume within the inner or interior volume 105.

An actuator 124 is coupled to the shaft 122 opposite the shield 116. An actuator 124 is configured to rotate the shield 116, as indicated by arrow 126, and move the shield 116 up and down along a central axis 130 of the process chamber 100, as indicated by arrow 128. When the shield 116 is moved up into a retracted position so that a face of the shield surrounding the hole 118 is behind a face of the target (e.g., dielectric target 104) facing the substrate 136, materials sputtered in a dark space surrounding the target (e.g., on a sidewall of the hole 118) are minimized. As a result, materials sputtered from one target (e.g. dielectric target 104) do not contaminate another target (e.g., metallic target 106) due to sputtering of material that has accumulated in the dark space.

The process chamber 100 also uses the shield 116 to surround the interior volume 105 of the process chamber 100 and to protect other chamber components besides the targets 104, 106 from damage and/or contamination from processing. During processing, source material from a target 104, 106 is sputtered onto the substrate 136. The sputtering process forms a thin deposition layer or film of the source material on the surface of the substrate 136. The sputtering process, however, not only deposits source material on the substrate 136, but also on the shield 116 and other surfaces of the interior volume 105. The extra deposits are unwanted coatings or depositions on surfaces other than the substrate 136 and may generate particles that can break away from the interior surfaces and fall onto the substrate 136. These particles may cause defects in the deposition layer or film on the surface of the substrate 136. Particle generation is a significant and long standing problem for substrate processing.

The process chamber 100 may include a plurality of RF grounding rings 144 to provide improved grounding of the shield 116 to the grounded chamber body adapter 108 when the shield is in the retracted position. The RF grounding rings 144 advantageously prevent the shield 116 from getting negatively charged by minimizing the energy between the plasma and the shield.

The process chamber 100 may further include a process gas supply 146 to supply a predetermined process gas to an interior volume 105 of the process chamber 100. For example, the process gas supply 146 may supply oxygen to the interior volume 105 after the metallic target 106 has been sputtered as discussed in more detail below. The process chamber 100 may also include an exhaust pump 148 fluidly coupled to the interior volume 105 to exhaust the process gas and to facilitate in maintaining a desired pressure inside the process chamber 100. Pressure level adjustment is used in some embodiments of the present principles and is discussed in more detail below.

The process chamber 100 can be used in the processing of many new memory products such as, for example, spin-transfer torque magnetic random access memory (STT-MRAM). STT-MRAM have a layered deposition stack that is dependent on a critical tunneling barrier layer. The typical dielectric material used for this barrier layer is magnesium oxide (MgO). The MgO deposition layer can be deposited using DC power as $Mg+O^2$ (oxygen is flowed into the chamber while the Mg is being deposited on a wafer) or using RF power as MgO (an MgO sputtering target is used for wafer deposition). However, DC power does not operate efficiently with dielectric films due to the buildup of dielectric material on the interior surfaces of the process chamber. AC powered processes, such as RF powered processes, work better with dielectric materials.

The increased semiconductor industry demand for high quality MgO deposition has highlighted the long standing problem of defects that occur when using RF powered processes with dielectric target materials. Previous defect reducing techniques used in constructing MgO deposition layers for use in hard drives still yielded defects that were too large for use with semiconductor devices such as memory with tunneling barrier layers. In the hard drive industry, MgO defects in the 120 nm to 150 nm range are considered acceptable. However, for the integrated circuit (IC) industry, the defects are desired to be 35 nm or less.

A predominate source of these defects is the deposition of the MgO onto the shield and other processing volume surfaces surrounding the wafer during processing (see, for example, the inner surfaces of interior volume 105 of FIG. 1). RF powered processes can use a dielectric material target such as, for example, MgO, aluminum oxide ($Al_2O_3$) or other dielectric materials for dielectric deposition (in contrast, DC powered processes must start with metallic targets and flow oxygen to deposit dielectric films). When these films are deposited on a shield or other processing volume surfaces, the deposition creates particles due to dielectric powder formation, arcing caused by the charge on the dielectric film, and/or peeling (flaking off) of the film due to poor adhesion.

To reduce these problems, a pasting layer is typically sputtered onto the shield after a dielectric layer. The long term industry standard for the pasting layer material has been titanium (Ti) or a derived form of Ti. Ti is a relatively inexpensive and readily available metal. Ti can also be used to getter trace remnants of gases to help achieve a high vacuum in the process chamber. The Ti pasting layer serves to encapsulate the MgO shield layer to reduce MgO particles from falling onto a wafer during processing. However, the defect reduction performance of Ti is very poor for defects less than 120 nm. While this defect size is acceptable for technologies in the hard drive industry, this defect size is undesirable for the IC industry. Despite this undesirable effect, Ti continued as the industry standard for pasting of dielectric materials because a better solution could not be found. However, the inventors have progressed to a new level of defect management in depositions by using tantalum (Ta) as a pasting layer over the dielectric material layer. Due to the high cost of Ta and Ta's high reactance with oxygen, Ta was not previously considered as a viable target material for pasting. Thus, the inventors unexpectedly discovered that by using the techniques of the present principles described herein, Ta actually outperformed Ti in defect management. The inventors also discovered that the much larger atomic size of Ta compared to Ti allowed for better coverage of the MgO shield layer, drastically reducing the number of defects and the size of the defects. In addition, the inventors also found that Ta has a low sputter yield, reducing contamination of the wafer deposition layer.

Figure 2:
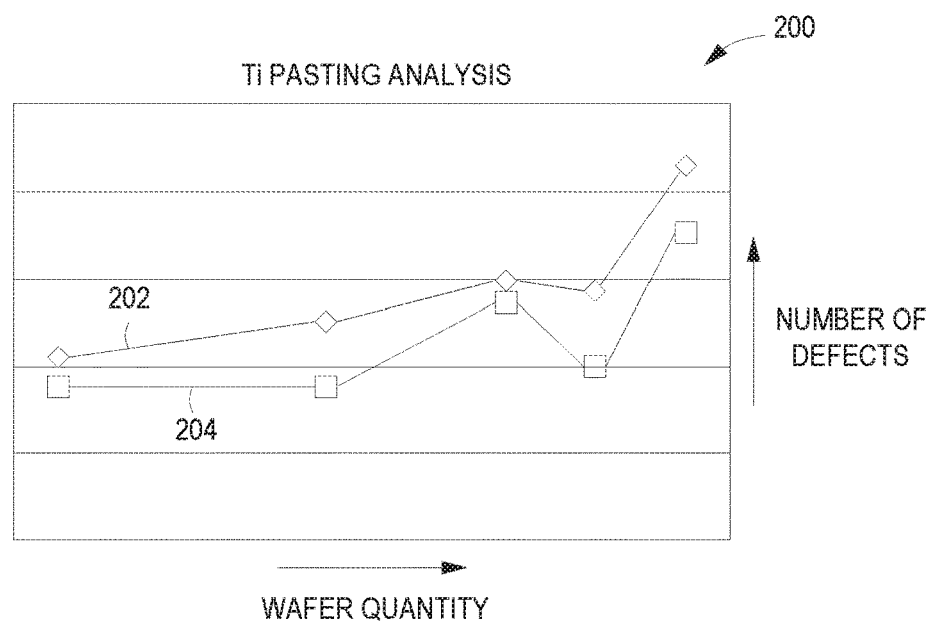
FIG. 2 depicts titanium pasting data obtained in accordance with some embodiments of the present principles.
Figure 3:
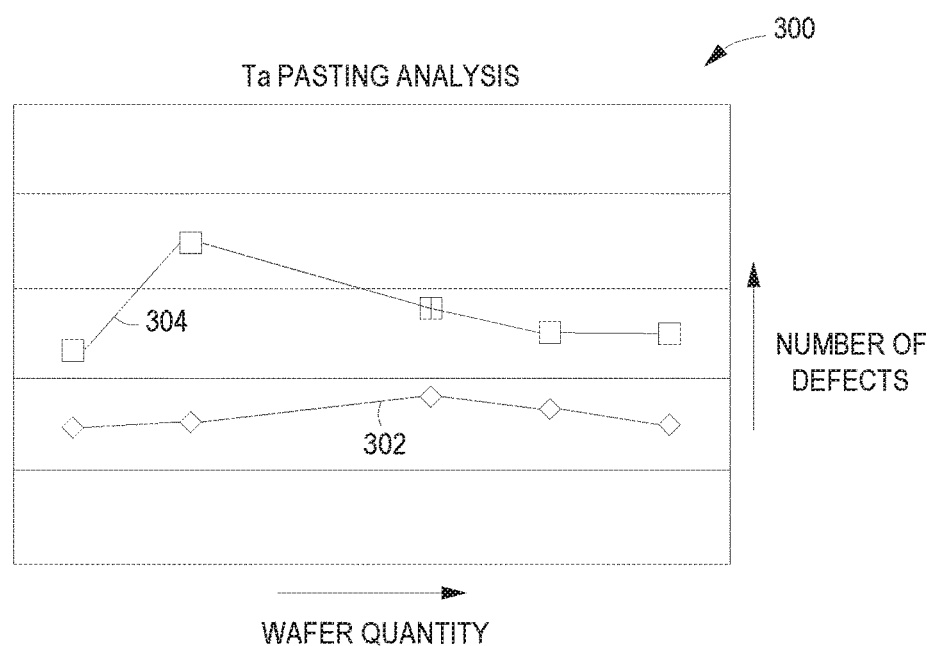
FIG. 3 depicts tantalum pasting data in accordance with some embodiments of the present principles.

The inventors conducted tests using Ti and Ta as pasting layers over a dielectric material (see, for example, FIGS. 2 and 3, respectively). The dielectric material used in both Ti and Ta tests was MgO. The data trends of the small defects 302 and large defects 304 for a Ta pasting layer (FIG. 3) showed a drop in the number of defects and the size of the defects on a wafer deposition layer when compared to a Ti pasting layer (FIG. 2). The Ti pasting layer test results 200 were not consistent over the wafer production run and both small 202 and large 204 defects trended upwards over the wafer production run. The Ta pasting layer results 300 were much more consistent over wafer the production run with less overall defects both in small defects 302 and large defects 304 and trended downward as the production run progressed.

Additional tests were conducted to further enhance the coverage of the Ta pasting layer over the dielectric material layer. The chamber pressure was increased during the Ta pasting—from approximately 2 mTorr to approximately 20 mTorr. A decrease in the number and size of defects occurred up to and including approximately 10 mTorr. From approximately 10 mTorr to approximately 20 mTorr, the decrease in the number and size of the defects was minor. Higher pressures helped to disperse the Ta pasting layer into areas of the chamber not reachable with lower pressures, providing better coverage and, therefore, less defects. Approximately 10 mTorr was effective in reducing defects and providing good dispersion. Adjustments in pressure beyond approximately 10 mTorr allowed for increased dispersion and a slight decrease in defects. The inventors also determined that if oxygen was flowed into the chamber after the Ta pasting process, less defects occurred. The reduced defects were due to the oxygen joining with the Ta to form a tantalum oxide (TaO) layer over the Ta pasting layer, creating a stronger holding bond.

Figure 4:
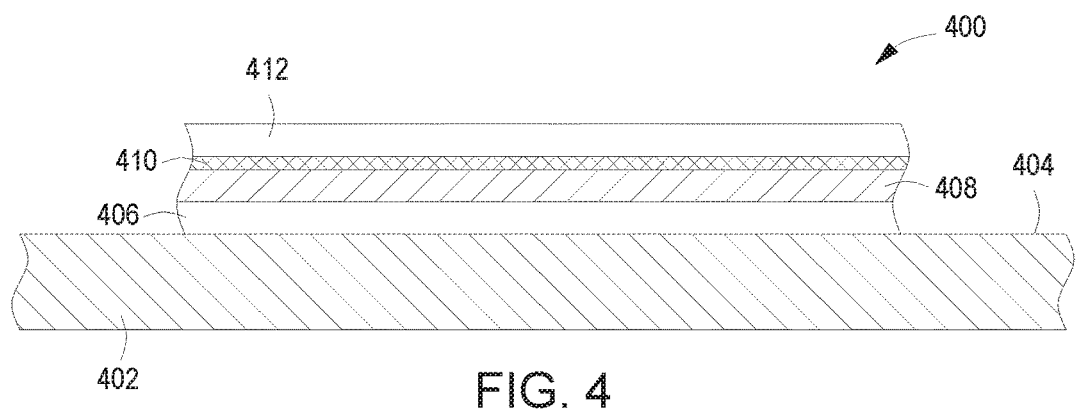
FIG. 4 depicts a portion of an inner volume surface of a process chamber in accordance with some embodiments of the present principles

FIG. 4 depicts a portion 402 of an inner surface of a PVD process chamber (see, for example, 100 in FIG. 1) in accordance with an embodiment of the present principles. For example, the portion 402 of an inner surface can be a portion of the shield 116 or even a portion of the dark space shield 179 or other portions of a surface of the interior volume 105 of FIG. 1. In the following examples, each described layer may completely cover a surface or another layer or only partially cover a surface or another layer. There may also be overlapping of one layer on another layer not deposited in a prior step (e.g., if a second layer did not provide complete coverage over a first layer, a third layer might be deposited not only on the second layer, but also on a portion of the first layer, etc.).

When a dielectric target material such as magnesium oxide is sputtered onto a wafer such as substrate 136 of FIG. 1, the dielectric material is also sputtered onto a surface 404 of the portion 402 of the inner surface forming a dielectric material layer 406. The dielectric material layer 406 is undesired but is a byproduct of the wafer deposition process. The dielectric material layer 406 can cause particle formation due to flaking, powder residue, and/or arcing from a buildup of electric charge. These particles may fall onto the wafer or substrate 136 during subsequent deposition processes. To reduce the formation of particles from the dielectric material layer 406, a target made of a Ta material is sputtered to form a Ta pasting layer 408 over the top of the dielectric material layer 406. The Ta pasting layer 408 helps to control particle formation by encapsulating the dielectric material layer 406. The inventors have discovered that a Ta pasting layer 408 of approximately 10 Å (Angstroms) in thickness can provide a significant reduction in wafer defects.

The inventors discovered, however, that if a subsequent dielectric material deposition process is performed at this point, the Ta pasting layer 408 will remove oxygen from the process, leading to contamination of the dielectric material deposition layer on the wafer. Therefore, the Ta target is removed or shielded from the process chamber 100 and replaced by a target made from a dielectric material. In a multi-cathode process chamber such as the process chamber 100 shown in FIG. 1, the shield 116 can be rotated with the actuator 124 to cover the Ta target and at the same time expose a dielectric target to the interior volume 105. Oxygen is then flowed into the process chamber 100 via the process gas supply 146 and allowed to interact with the Ta pasting layer 408 to form a tantalum oxide (TaO) layer 410 on the Ta pasting layer 408. The oxygen flow helps to bond the Ta pasting layer 408 to reduce particle generation and also to prevent the Ta pasting layer 408 from removing oxygen from subsequent deposition processes, leading to reduced contamination of the dielectric material deposition layer on the wafer. The dielectric material target is then sputtered to form a second dielectric material film layer 412 over the TaO layer 410. The cleaning process further reduces possible contamination of a subsequent dielectric material deposition layer on a wafer.

Figure 5:
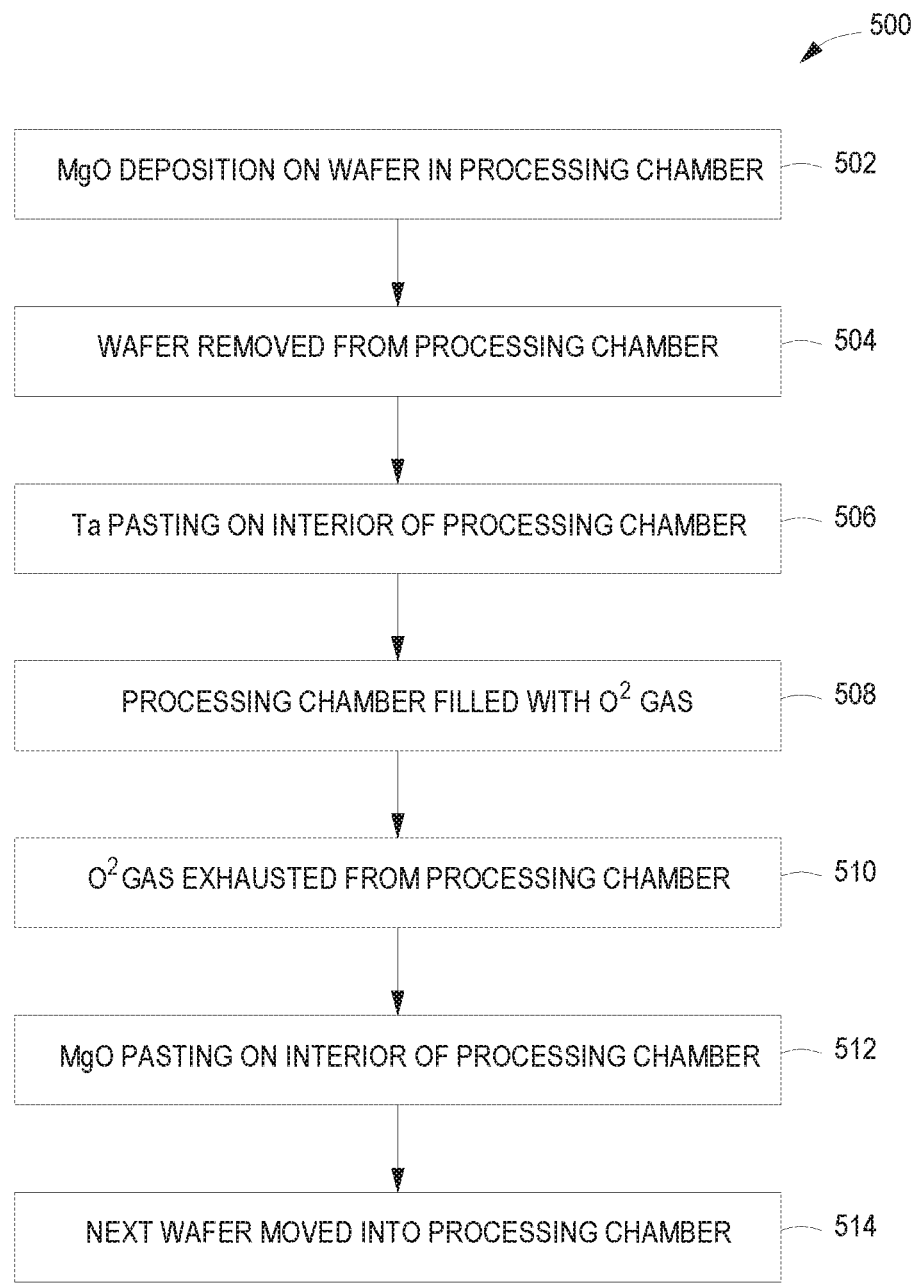
FIG. 5 is a flowchart illustrating a method of processing a substrate in accordance with some embodiments of the present principles.

FIG. 5 is a flowchart illustrating a method 500 of processing a substrate in accordance with embodiments of the present principles. A substrate or wafer is placed into a deposition chamber. Sputtering is performed with a dielectric material target such as, for example, an MgO target, to deposit a film or layer of the dielectric material on the surface of the wafer, as indicated at 502. Once the deposition of the dielectric material layer is completed, the wafer is removed from the process chamber, as indicated at 504. At this point, the sputtering of the dielectric material also produces a layer of dielectric material on at least a portion of the inner surface of the process chamber such as, for example, the shield.

Sputtering is then performed with a Ta material target to paste a layer of Ta over the dielectric material layer on at least a portion of the inner surface of the process chamber, as indicated at 506. The inventors have discovered that adjusting the pressure level within the process chamber helps to reduce wafer defects. Therefore, optionally, when sputtering the Ta material target, the pressure may be adjusted between approximately 10 mTorr and approximately 20 mTorr to increase the coverage of the Ta layer over the inner surfaces of the process chamber. The increased coverage helps to reduce defects resulting from particles generated by the dielectric material layer on the inner surfaces. A Ta layer of approximately 10 Å (angstroms) in thickness has been discovered to provide a reduction in defects of wafer deposition layers.

At the completion of the Ta sputtering, the target is changed to a dielectric material target such as, for example, an MgO target and, optionally, oxygen is injected into the process chamber and allowed to bond with the Ta pasting layer, as indicated at 508. Once the oxygen has finished bonding with the Ta pasting layer, the oxygen is exhausted out of the process chamber, as indicated at 510. The TaO layer that forms over the Ta pasting layer helps to keep particles from flaking off and creating defects in subsequent wafer dielectric material deposition layers.

The dielectric material target is then used to sputter another pasting layer over the oxygen enriched Ta pasting layer, as indicated at 512. If the dielectric material pasting layer is not performed, the Ta pasting layer might mix with a sputtered dielectric material in a subsequent deposition step, contaminating the deposition layer on the wafer's surface. Thus, this processing step is often referred to as a cleaning step to reduce contamination. The process helps to prepare the process chamber for the next wafer and reduces what is known as a first wafer effect. Typically, the first wafer run through a process chamber has above average contamination levels and defects. As the processing of wafers continues, these levels tend to average out with each subsequent wafer. Cleaning of the process chamber ensures that this phenomenon is severely reduced or completely eliminated.

After the dielectric material pasting layer is completed, the next wafer to be processed is loaded into the process chamber, as indicated at 514. The next wafer is then coated with a dielectric material deposition film, starting the process again. The pasting steps are not required to be performed after each dielectric material deposition onto a wafer. Ordinarily, pasting steps can occur as infrequently as every 100 to 200 wafers. The more frequently the pasting step is performed, the higher the purity of the dielectric deposition film on the wafer and the fewer the defects on the wafer's surface.

Every process of the method 500 is not required to be performed. Significant benefits (e.g., reduction of defects, less contamination) can be achieved with the combination of a dielectric material target and Ta target pasting alone. The introduction of the oxygen and/or adjustments to the pressure levels enhance the overall effectiveness of the dielectric material/Ta target combination but are not required.

Thus, embodiments of Ta and dielectric target pasting are provided herein. The inventive Ta and dielectric material target pasting may facilitate decreased defects and increased purity of dielectric material depositions in an RF PVD process chamber by preventing or reducing particle production from the shield and other inner structure surfaces of the process chamber.

While the foregoing is directed to embodiments of the present disclosure, other and further embodiments of the disclosure may be devised without departing from the basic scope thereof.

The invention claimed is:

1. A method for performing pasting in a deposition chamber, comprising:

selecting a tantalum material target as an active deposition sputtering target in the deposition chamber, wherein the deposition chamber is a multi-cathode physical vapor deposition (PVD) chamber with a plurality of selectable sputtering targets with sputtering surfaces disposed at an angle of approximately 10 degrees to approximately 50 degrees relative to a substrate support surface having a substrate of the deposition chamber and a shield rotatable to select the active deposition sputtering target, wherein the plurality of selectable sputtering targets includes the tantalum material target and a dielectric material target, and wherein the dielectric material target is selected from the group consisting of a magnesium oxide (MgO) target and an aluminum oxide ($Al_2O_3$) target;

adjusting a pressure level of the deposition chamber to approximately 10 Torr;

encapsulating, with a tantalum pasting layer sputtered from the tantalum material target, a first dielectric material layer previously formed on the shield in an inner volume of the deposition chamber as a byproduct of a deposition process on a substrate, wherein the first dielectric material layer is formed by RF sputtering the dielectric material target towards the substrate in the deposition chamber, wherein the tantalum pasting layer encapsulates the first dielectric material layer to reduce particle defects caused by exposure of the first dielectric material layer on the shield during subsequent deposition processes on additional substrates in the deposition chamber, and wherein adjusting the pressure level to approximately 10 Torr enables the tantalum pasting layer to minimize a size and a number of defects originating from the shield;

increasing a holding bond of the tantalum pasting layer and preventing oxygen removal by the tantalum pasting layer during subsequent deposition processes by flowing oxygen into the deposition chamber to form tantalum oxide on the tantalum pasting layer after the tantalum pasting layer is deposited;

exhausting the oxygen from the deposition chamber;

selecting the dielectric material target as the exposed deposition sputtering target in the deposition chamber by rotating the shield; and depositing a second dielectric material layer on the tantalum oxide to form a second pasting layer by RF sputtering the dielectric material target, the second dielectric material layer preventing mixing of the tantalum pasting layer with a sputtered dielectric material of a subsequent dielectric material layer to reduce tantalum pasting layer contamination of subsequent dielectric material deposition layers.

2. The method of claim 1, further comprising:

performing the method of claim 1 only once every 100 to 200 substrates to maintain reduced contamination levels.

3. The method of claim 1, further comprising:

depositing the tantalum pasting layer to an approximate thickness of 10 Å.

\* \* \* \* \*